(12) United States Patent
Vest

(10) Patent No.: US 9,925,757 B2
(45) Date of Patent: Mar. 27, 2018

(54) CUSTOMIZABLE PRINTING PLATES AND METHOD OF MAKING THE SAME

(71) Applicant: MacDermid Graphics Solutions, LLC, Waterbury, CT (US)

(72) Inventor: Ryan W. Vest, Cumming, GA (US)

( * ) Notice: Subject to any disclaimer, the term of this patent is extended or adjusted under 35 U.S.C. 154(b) by 0 days.

(21) Appl. No.: 15/040,617

(22) Filed: Feb. 10, 2016

(65) Prior Publication Data

US 2017/0225446 A1    Aug. 10, 2017

(51) Int. Cl.
- *G03F 7/20* (2006.01)
- *B41C 1/00* (2006.01)
- *G03F 7/16* (2006.01)
- *G03F 7/32* (2006.01)

(52) U.S. Cl.
CPC ............... *B41C 1/003* (2013.01); *G03F 7/16* (2013.01); *G03F 7/20* (2013.01); *G03F 7/32* (2013.01)

(58) Field of Classification Search
CPC ....................................................... G03F 7/20
See application file for complete search history.

(56) References Cited

U.S. PATENT DOCUMENTS

| | | | |
|---|---|---|---|
| 4,427,759 A | 1/1984 | Gruetzmacher et al. | |
| 7,625,691 B2 * | 12/2009 | Bryant | G03F 7/0035 430/302 |
| 8,871,431 B2 * | 10/2014 | Gotsick | G03F 7/20 101/395 |
| 2004/0257972 A1 | 12/2004 | Kitano et al. | |
| 2007/0122748 A1 * | 5/2007 | Bryant | G03F 7/0035 430/302 |
| 2011/0300398 A1 | 12/2011 | Vest et al. | |
| 2012/0000384 A1 | 1/2012 | Vest | |
| 2013/0040243 A1 * | 2/2013 | Gotsick | G03F 7/20 430/306 |
| 2014/0174666 A1 | 6/2014 | Roshelli, Jr. et al. | |

* cited by examiner

*Primary Examiner* — Chanceity Robinson
(74) *Attorney, Agent, or Firm* — Carmody Torrance Sandak & Hennessey LLP

(57) ABSTRACT

A method of creating a custom relief image printing element from at least one raw photocurable material and at least one lamination layer supplied by a manufacturer is described. The manufacturer provides a menu of raw photocurable materials and a menu of lamination layers and wherein the customer selects at least one raw photocurable material from the menu of raw photocurable materials and selects at least one lamination layer from the menu of lamination layers. The method includes the steps of: a) laminating the selected at least one raw photocurable material to the selected at least one lamination layer at a customer's location to create a photocurable printing blank; and thereafter b) imagewise exposing the at least one photocurable printing blank to actinic radiation at the customer's location to crosslink and cure portions of the at least one photocurable material and create a relief image therein. A lamination system is also described.

8 Claims, 1 Drawing Sheet

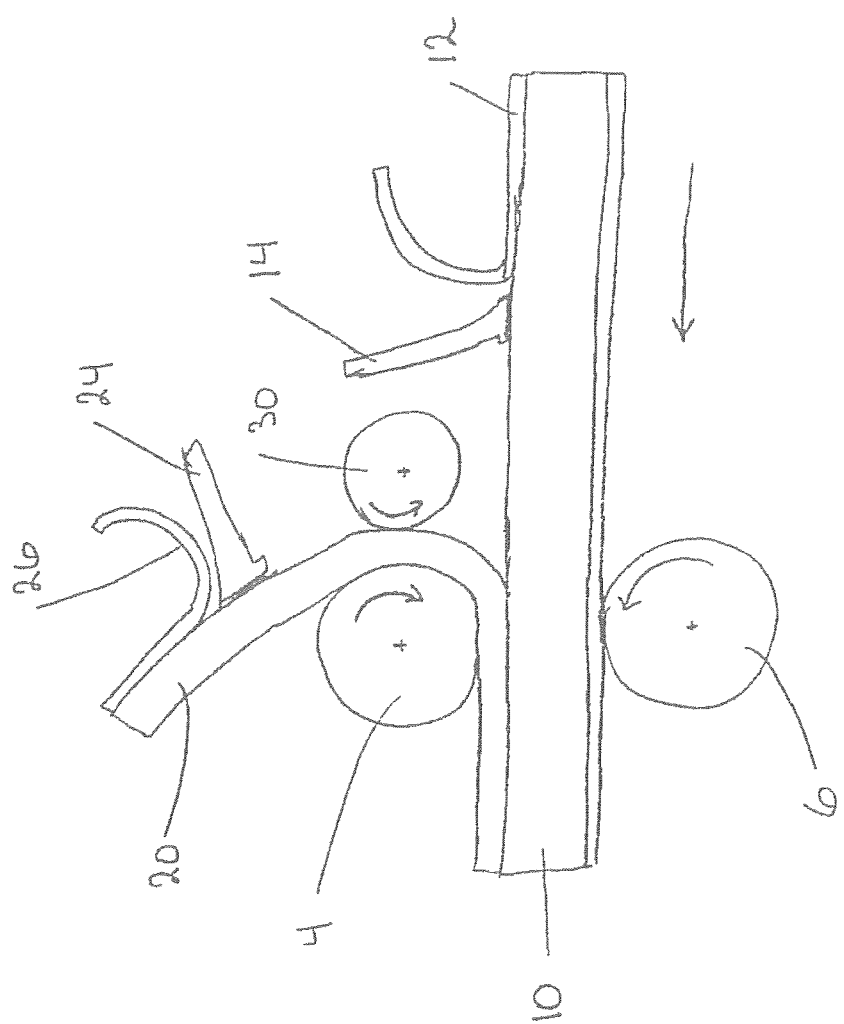

CUSTOMIZABLE PRINTING PLATES AND METHOD OF MAKING THE SAME

FIELD OF THE INVENTION

The present invention relates generally to the production of customizable flexographic printing plates and a method of making the same.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

In flexographic printing, ink is transferred from a pool of ink to a substrate by way of a printing plate. The surface of the plate is shaped so that the image to be printed appears in relief, in the same way that rubber stamps are cut so as to have the printed image appear in relief on the surface of the rubber. Typically, the plate is mounted on a cylinder, and the cylinder rotates at a high speed such that the raised surface of the printing plate contacts a pool of ink, is slightly wetted by the ink, then exits the ink pool and contacts a substrate material, thereby transferring ink from the raised surface of the plate to the substrate material to form a printed substrate. Those involved in the flexographic printing industry are constantly striving to improve the flexographic printing process in order to more effectively compete.

Flexographic printing plates are relief plates with image elements raised above open areas. Such plates offer a number of advantages to the printer, based chiefly on their durability and the ease with which they can be made. A typical flexographic printing plate as delivered by its manufacturer is a multilayered article made of, in order, a backing or support layer; one or more unexposed photocurable layers; optionally a protective layer or slip film; and often, a protective cover sheet.

The backing layer lends support to the plate and can be formed from a transparent or opaque material such as paper, cellulose film, plastic, or metal. Preferred materials include sheets made from synthetic polymeric materials such as polyesters, polystyrene, polyolefins, polyamides, and the like. One widely used support layer is a flexible film of polyethylene terephthalate.

The photopolymer layer(s) can include any of the known binders (oligomers), monomers, initiators, reactive or non-reactive diluents, fillers, and dyes. The term "photocurable" or "photopolymer" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photopolymer materials include an elastomeric compound (binder), an ethylenically unsaturated compound having at least one terminal ethylene group, and a photoinitiator. More than one photocurable layer may also be used. Examples of some suitable photocurable materials are described in European Patent Application Nos. 0 456 336 A2 and 0 640 878 A1 to Goss, et al., British Patent No. 1,366,769, U.S. Pat. No. 5,223,375 to Berrier, et al., U.S. Pat. No. 3,867,153 to MacLahan, U.S. Pat. No. 4,264,705 to Allen, U.S. Pat. Nos. 4,323,636, 4,323,637, 4,369,246, and 4,423,135 all to Chen, et al., U.S. Pat. No. 3,265,765 to Holden, et al., U.S. Pat. No. 4,320,188 to Heinz, et al., U.S. Pat. No. 4,427,759 to Gruetzmacher, et al., U.S. Pat. No. 4,622,088 to Min, and U.S. Pat. No. 5,135,827 to Bohm, et al., the subject matter of each of which is herein incorporated by reference in its entirety.

The photopolymer materials generally cross-link (cure) and harden through radical polymerization in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions.

The slip film is a thin layer, which generally rests upon and protects the photopolymer from dust and increases its ease of handling. In a conventional ("analog") plate making process, the slip film is transparent to UV light. The printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer. In another alternative, the negative may be placed directly on the at least one photocurable layer.

In a "digital" or "direct to plate" plate making process, a laser is guided by an image stored in an electronic data file and is used to create an in situ negative in a digital (i.e., laser ablatable) masking layer. The digital masking layer is typically a slip film which has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety. Other methods of creating an in situ negative are also known.

After imaging, the photosensitive printing element is developed to remove the unpolymerized portions of the layer of photopolymer material and reveal the crosslinked relief image in the cured photosensitive printing element. Typical methods of development include washing with various solvents or water, often with a brush. Other possibilities for development include the use of an air knife or heat plus a blotter (i.e. thermal development). The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a printing press and printing commenced.

Photocurable resin compositions typically cure through radical polymerization, upon exposure to actinic radiation. However, the curing reaction can be inhibited by molecular oxygen, which is typically dissolved in the resin compositions, because the oxygen functions as a radical scavenger. Based thereon, the dissolved oxygen can be removed from the resin composition before image-wise exposure so that the photocurable resin composition can be more rapidly and uniformly cured.

One process that has been developed for removing dissolved oxygen from the photosensitive resin involves the use of a laminated oxygen barrier layer, as described, for example, in U.S. Pat. Pub. No. 2014.0004466 to Vest et al., the subject matter of which is herein incorporated by reference in its entirety. The barrier membrane is laminated on top of the flexo plate to cover the in situ mask and any uncovered portions of photocurable layer. The membrane can be applied after the laser ablation used to create the in situ mask, but before exposure to actinic radiation.

Effective barrier layers generally exhibit optical transparency, low thickness and oxygen transport inhibition. Examples of materials which are suitable for use as the barrier membrane layer include those materials that are conventionally used as a release layer in flexographic printing elements, such as polyamides, polyvinyl alcohol, hydroxyalkyl cellulose, copolymers of ethylene and vinyl acetate, amphoteric interpolymers, cellulose acetate butyrate, alkyl cellulose, butryal, cyclic rubbers, and combinations of one or more of the foregoing. In addition, films such as polypropylene, polyethylene, polyvinyl chloride, polyester and similar clear films can also serve well as barrier films.

A typical process for producing a relief image printing element from an analog printing element generally involves the customer performing the following steps:

a) obtaining an unexposed printing element from the manufacturer, the unexposed printing element comprising one or more photocurable layers disposed on a substrate layer, a slip film layer disposed on the one or more photocurable layers and a protective coversheet;

b) removing the protective coversheet from the unexposed printing element and applying a photographic negative on top of the slip film layer;

c) optionally, laminating an oxygen barrier layer to the top of the photographic negative;

d) exposing the one or more photocurable layers to actinic radiation through the photographic negative to selectively crosslink and cure portions of the one or more photocurable layers, wherein the at least one photocurable layer is crosslinked and cured in the areas that are not covered by the negative, thereby creating the desired relief image;

e) removing the negative (and the oxygen barrier membrane, if used) from the top of the at least one photocurable layer; and f) developing the printing blank to remove uncured portions of the photocurable layer and reveal the desired relief image;

A typical process for producing a relief image printing element from a digital printing element generally involves the customer performing the following steps:

a) obtaining an unexposed digital printing element from the manufacturer, the unexposed printing element comprising one or more photocurable layers disposed on a substrate layer, a laser ablatable layer disposed on the one or more photocurable layers and a protective coversheet;

b) imaging the at least one photocurable layer by selectively ablating the laser ablatable mask layer to create an image on the surface of the at least one photocurable layer;

c) optionally, laminating an oxygen barrier membrane to a top of the laser ablated mask layer;

d) exposing the printing blank to actinic radiation through the oxygen barrier membrane and laser ablated mask layer (and the oxygen barrier membrane, if used) to one or more sources of actinic radiation to selectively crosslink and cure portions of the at least one photocurable layer, wherein the at least one photocurable layer is crosslinked and cured in the portions not covered by the mask layer, thereby creating the relief pattern;

e) removing the oxygen barrier membrane (if used) from the top of the laser ablated mask layer; and f) developing the printing blank remove the laser ablated mask layer and uncured portions of the photocurable layer and reveal the relief pattern.

In both instances, the customer must choose a pre-configured printing element blank from a menu of printing element blanks offered by the manufacturer. The customer does not have any control over the particular configuration of the printing element. Thus, the selected printing element may not be the most suitable for the customer's printing requirements. Furthermore, the manufacturer must also maintain an extensive menu of printing element configurations to offer to customers. These configurations include, for example, digital and analog plate configurations, which may have different photocurable layers with different formulations, with and without cap layers, and with and without other specialized layers. This can lead to the need for additional storage space on the part of both the manufacturer and the customer for the many different products. In addition, there is also the additional expense and associated waste in connection therewith if a customer must go through trial and error to select a particular printing plate configuration that might or might not be suitable for their particular needs.

Thus, it would be desirable in the art to provide a method of creating a custom relief image printing blank that would allow a customer to configure a printing plate according to their particular needs and that would allow a manufacturer to offer various raw materials for such configuration.

SUMMARY OF THE INVENTION

It is an object of the present invention to provide raw materials that allow printing plate customers the ability to configure printing plate blanks according to their unique needs.

It is another object of the present invention to provide raw materials that allow printing plate customers the ability to configure digital or analog relief image printing plates according to their unique needs.

It is still another object of the present invention to provide a streamlined method of doing business that allows the customer greater flexibility.

It is still another object of the present invention to provide greater economy to both the printing plate manufacturer and the printing plate customer.

To that end, in one embodiment, the present invention relates generally to a method of creating a custom relief image printing element from at least one raw photocurable material and at least one lamination layer supplied by a manufacturer, wherein the manufacturer provides a menu of raw photocurable materials and a menu of lamination layers, and wherein the customer selects at least one raw photocurable material from the menu of raw photocurable materials and selects at least one lamination layer from the menu of lamination layers; the method comprising the steps of:
   a) selecting at least one raw photocurable material from the menu of raw photocurable materials and at least one lamination layer from the menu of lamination layers;
   b) laminating the selected at least one raw photocurable material to the selected at least one lamination layer at a customer's location to create a photocurable printing blank; and thereafter
   c) imagewise exposing the at least one photocurable printing blank to actinic radiation at the customer's location to crosslink and cure portions of the at least one photocurable material and create a relief image therein.

In another embodiment, the present invention also relates generally to a lamination system to create a custom laminated photocurable printing blank. In one embodiment, the lamination system comprises:
   a) a heatable laminating roller and a second roller, wherein said heatable laminating roller and said second roller are opposably mounted and form a nip therebetween for receiving a substrate to be laminated, wherein the substrate comprises a strippable cover sheet on a first surface thereof;
   b) a first stripping device for stripping the strippable cover sheet from the first surface of the substrate,
   c) a drive mechanism for rotating the heatable laminating roller and second roller, wherein the heatable laminating roller is rotated in a first direction and the second roller is rotated in an opposite direction to advance the substrate through the nip formed between the heatable laminating roller and second roller;
   d) a supplying device for supplying a lamination film into the nip formed between the heatable lamination roller and the second roller, wherein the supplying device comprises a second stripping device for stripping a cover sheet from a first surface of the lamination film prior to the lamination film entering the nip, wherein the first surface of the lamination film contacts the first surface of the substrate at a point where the substrate advances through the nip.

In another embodiment, the present invention also relates generally to a menu system for ordering various individual components of a photocurable printing blank to create a custom laminated printing blank comprising the various individual components, the menu system comprising:
   a) a first menu comprising a listing of one or more raw photocurable materials;
   b) a second menu comprising a listing of one or more lamination layers, wherein the one or more lamination layers are capable of being laminated to the one or more raw photocurable materials to create the laminated photocurable printing blank; and
   wherein a customer selects one or more raw photocurable materials from the first menu and one or more lamination layers from the second menu and then laminates or otherwise adheres the one more photocurable materials and one or more lamination layers together to form a custom laminated printing blank.

BRIEF DESCRIPTION OF THE FIGURES

FIG. 1 depicts a lamination system in accordance with one embodiment of the present invention.

DETAILED DESCRIPTION OF THE PREFERRED EMBODIMENTS

The present invention relates generally to an improved method of creating a photocurable printing element from a custom printing blank.

In one embodiment, the present invention relates to a method of creating a custom relief image printing element from at least one raw photocurable material and at least one lamination layer supplied by a manufacturer, wherein the manufacturer provides a menu of raw photocurable materials and a menu of lamination layers, and wherein the customer selects at least one raw photocurable material from the menu of raw photocurable materials and selects at least one lamination layer from the menu of lamination layers; the method comprising the steps of:
   a) selecting at least one raw photocurable material from the menu of raw photocurable materials and at least one lamination layer from the menu of lamination layers;
   b) laminating the selected at least one raw photocurable material to the selected at least one lamination layer at a customer's location to create a photocurable printing blank; and thereafter
   c) imagewise exposing the at least one photocurable printing blank to actinic radiation at the customer's location to crosslink and cure portions of the at least one photocurable material and create a relief image therein.

As described herein, the present invention allows a customer to select individual printing plate components and produce a fully customizable plate in an efficient manner.

The customer first chooses a raw photocurable material from a menu of raw photocurable materials based on their particular needs. In addition, the customer may also choose a particular size and thickness of the raw photocurable material from the menu. The manufacturer may offer a menu of various gauges of the raw photocurable materials to produce a desired printing plate gauge. In addition, the manufacturer may offer relatively thin gauges of raw photocurable material that the customer can laminate or otherwise adhere together to produce printing element of the desired gauge.

As described herein, the raw photocurable materials typically comprise any of the known monomers, binders, photoinitiators, reactive or nonreactive diluents, fillers and dyes. These raw photocurable materials may be formulated, for example, for use with particular inks, for development with particular solvents or thermal development, for printing on particular substrates (i.e., paper, plastic or corrugated cardboards), to exhibit a particular Shore A hardness value, etc.

Suitable monomers include, for example, multifunctional acrylates, multifunctional methacrylates and polyacryloyl oligomers. Examples of suitable monomers include one or more of ethylene glycol diacrylate, hexanediol diacrylate, diethylene glycol diacrylate, glycerol diacrylate, trimethylol propane triacrylate, hexane diol dimethacrylate, glycerol triacrylate, trimethylolpropane triacrylate, ethylene glycol dimethacrylate, 1,3-propanediol dimethacrylate, 1,2,4-butanetriol trimethacrylate, 1,4-butanediol diacrylate, and combinations of one or more of the foregoing.

The binder or oligomer preferably comprises an A-B-A type block copolymer where A represents a non-elastomeric block, preferably a vinyl polymer or most preferably polystyrene, and B represents an elastomeric block, preferably polybutadiene or polyisoprene. Suitable polymerizable oligomers may also be used in the compositions of the invention and preferred oligomers include those that are polymerized from the monofunctional and/or polyfunctional monomers disclosed above. Particularly preferred oligomers include epoxy acrylates, aliphatic urethane acrylates, aromatic urethane acrylates, polyester acrylates, polyether acrylates, amine modified polyether acrylates and straight-chained acrylic oligomers.

The photo-initiator absorbs light and is responsible for the production of free radicals or cations. Free radicals or cations are high-energy species that induce polymerization. Suitable photoinitiators for use in the raw photocurable material and the photocurable cap layer include quinones, benzophenone and substituted benzophenones, hydroxyl alkyl phenyl acetophenones, dialkoxy acetophenones such as 2,2-diethoxyacetophenone and 2,2-dimethoxy-2-phenyl acetophenone, α-halogeno-acetophenones, aryl ketones (such as 1-hydroxycyclohexyl phenyl ketone), 2-hydroxy-2-methyl-1-phenylpropan-1-one, 2-benzyl-2-dimethyl-amino-(4-morpholinophenyl) butan-1-one, thioxanthones (such as isopropylthioxanthone), benzil dimethylketal, bis (2,6-dimethylbenzoyl)-2,4,4-trimethylpentylphosphine oxide, trimethylbenzoyl phosphine oxide derivatives such as 2,4,6trimethylbenzoyldiphenylphosphine oxide, methyl thio phenyl morpholino ketones such as 2-methyl-1-[4-(methylthio) phenyl]-2-morpholinopropan-1-one, morpholino phenyl amino ketones, 2,2-dimethoxy-1,2-diphenylethan-1-one or 5,7-diiodo-3-butoxy-6-fluorone, diphenyliodonium fluoride and triphenylsulfonium hexafluophosphate, benzoin ethers, peroxides, biimidazoles, benzyl dimethyl ketal, aminoketones, benzoyl cyclohexanol, oxysulfonyl ketones, sulfonyl ketones, benzoyl oxime esters, camphorquinones, ketocoumarins, Michler's ketone, halogenated alkyl aryl ketones, α-hydroxy-α-cyclohexyl phenyl ketone and combinations of one or more of the foregoing.

Other optional ingredients for use in the at least one photocurable layer include inhibitors, plasticizers, dyes, polymers, oligomers, pigments, sensitizers, synergists, tertiary organic amines, UV absorbers, thixotropes, anti-oxidants, oxygen scavengers, flow modifiers, fillers and combinations of one or more of the foregoing.

The at least one photocurable layer should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm.

Once the customer has selected a particular raw photocurable material based on their needs, the customer may also choose from a menu of lamination materials that may be laminated to the raw photocurable blank to produce the desired relief image printing blank element. A non-limiting list of lamination materials that may be laminated to one another, or to the raw photocurable material, includes:
1) backing layers;
2) cover sheets or films;
3) adhesive layers;
4) additional raw photocurable layers;
5) cap layers;
6) compressible layers;
7) slip films and release layers;
8) laser ablatable layers;
9) oxygen barrier layers;
10) masking layers; and
11) other intermediate layers.

For example, the customer can choose one or more of desired backing sheets, intermediate layer, masking layers, and cover films. The customer then laminates these one or more layers to the raw photocurable material to produce a printing element blank that may be processed in the various processing steps to produce a relief image printing plate, and which is then subsequently transferred to a printing press and printing commenced.

In one embodiment, the raw photocurable material is shipped to the customer with a backing layer adhered to a first side of the raw photocurable printing blank and a strippable coversheet affixed to a second side of the raw photocurable printing blank. In this instance, the customer removes the strippable coversheet from the second side of the raw photocurable printing blank and then laminates or otherwise adheres one or more additional lamination layers to the second side of the raw photocurable material. The one or more additional lamination layers may also each contain a strippable cover sheet or layer to protect the one or more additional lamination layers from damage during transport. Thus, the strippable cover sheet or layer must also be removed from at least the side of the one or more additional lamination layers that is laminated or otherwise adhered to the second side of the raw photocurable material or that is laminated or otherwise adhered to the top of another of the one or more additional lamination layers.

In another embodiment, the raw photocurable printing blank is shipped to the customer with a first strippable coversheet attached to a first side of the raw photocurable printing blank and a second strippable coversheet attached to a second side of the raw photocurable printing blank. In this instance, the customer would remove the first strippable coversheet from the first side of the raw photocurable printing blank and then laminate or otherwise adhere one or more backing layers to the first side of the raw photocurable printing blank and would also remove the second strippable coversheet from the second side of the raw photocurable printing blank and then laminate or otherwise adhere one or more additional layers to the second side of the raw photocurable printing blank.

By laminated or otherwise adhered, what is meant is that the lamination layers and the raw photocurable layer(s) are joined together using one or more of heat, pressure and adhesive. For example, in some instances, the lamination layer that is to be laminated to the raw photocurable material or other lamination layer is tacky or sticky at room temperature or an adhesion layer may be used. Thus, the one or more lamination rollers may not need to be heated, and pressure alone is sufficient to ensure strong adhesion of the layers. The lamination step must also be conducted under processing conditions that do not cause premature photocuring or photopolymerization of the raw photocurable material or that do not cause damage to any of the lamination layers. Thus, in some embodiments, it would not be desirable to use heat because heat could cause premature photocuring or, on the other hand, the heat must be adjusted to a lower value that does not cause any premature photocuring. At the same time, the processing conditions must be such that good adhesion is achieved between the raw photocurable material and the adjacent lamination layer and between one or more lamination layers in the laminated printing blank.

The backing (or support) layer lends support to raw photocurable material and can be formed from a transparent or opaque material such as paper, cellulose film, plastic, or metal. The backing layer is preferably formed from a variety of flexible, transparent materials. Examples of such materials are cellulose films or plastics such as, for example, PET (polyethylene terephthalate), PEN (polyethylene naphthalate), polyether, polyethylene, polyamide (Kevlar) or nylon. One preferred support layer is polyethylene terephthalate (PET). In addition, the one or more backing films may also comprises a compressible layer. Finally, the one or more backing films may also comprise an antihalation layer which is disposed between the backing or support layer and the one or more photocurable layers. The antihalation layer is used to minimize halation caused by the scattering of UV light within the non-image areas of the photocurable resin layer.

The strippable cover sheet generally comprises any suitable substrate, including, but not limited to plastic sheets and films, such as polyethylene terephthalate and polyethylene naphthalate, fluorene polyester polymers, polyethylene, polypropylene acrylics, polyvinyl chloride and copolymers thereof, and hydrolyzed and non-hydrolyzed cellulose acetate, among others. It is important that the strippable coversheet remain securely in place on the raw photocurable material during transport yet be cleanly strippable from the raw photocurable material or other lamination layer such that it does not do any damage to the underlying surface of the raw photocurable material or other lamination layer. In one embodiment, the strippable cover sheet may be surface treated to modify its wettability.

The strippable cover sheet may also contain a release layer disposed thereon. Coatings suitable as a release layer include, for example, polyvinyl alcohol, cellulosic polymers, including methyl cellulose and hydroxypropyl methyl cellulose, polyvinyl butyral, and other hydroxyl-containing polymers, among others.

If an adhesive layer is used, it may be disposed below the strippable cover sheet and can be used to adhere various lamination layers and/or raw photocurable materials together. Thus, the strippable coversheet can be removed from the adhesive layer and the additional layers laminated or otherwise adhered to the adhesive layer. In another embodiment, the adhesive layer can be used to provide adhesion between the raw photocurable material and a backing sheet or a compressible layer. The adhesive layer enhances the adhesion of subsequently applied layers with the raw photocurable blank. The adhesive layer may contain a thermoplastic, thermal adhesive, or pressure sensitive adhesion by way of example and not limitation. In addition, the adhesive layer may or may not require heat to firmly affix the additional layers to the raw photocurable blank. This may be especially useful where the one or more additional lamination layers are especially heat sensitive and normal lamination temperatures would be unsuitable.

As described herein, the one or more additional lamination layers may comprise one or more additional raw photocurable materials or a cap layer, which may be of the same composition as the raw photocurable material or may be a different composition. The cap layer is a photocurable layer which may have a composition that is the same as or is different from the composition of the raw photocurable material. As described herein, the resulting printing element can be either a conventional printing element, in which a photographic negative is affixed to the raw photocurable material or the cap layer, or a digital printing element that utilizes a laser ablatable mask layer which is disposed on either the raw photocurable material or the cap layer. Thus, depending on whether or not the plate is a conventional analog plate or a digital plate, the cap layer may also be different. Thus, the customer may choose a suitable cap layer based on the method of imagewise exposing the photocurable element to actinic radiation. Furthermore, the choice of cap layer may also depend on the development method, as different materials may produce a beneficial result depending on whether the relief image printing element is developed or processed using solvent development or thermal development.

A slip film is a thin layer, which protects the raw photocurable material from dust and increases its ease of handling. In a conventional ("analog") plate making process, the slip film is transparent to UV light. In this process, the customer removes any strippable cover sheet and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. A negative can then be placed on the matte layer for subsequent UV-flood exposure of the photocurable layer.

Another lamination layer that may be laminated or otherwise adhered to the raw photocurable material is a laser ablatable mask layer. A computer is used to transfer digital information to the laser ablatable mask layer via a laser that is in communication with the computer that ablates those areas of the laser ablatable mask layer that have to cure, i.e., those areas that ultimately become the relief layer. The plate is then face exposed through the in-situ mask. The area of the laser ablatable mask layer that was not ablated prevents the underlying photopolymer from curing and is removed during the processing (development) step. That area where the mask was laser ablated is cured and becomes the relief area. Examples of laser ablatable mask layers are disclosed in, for example, U.S. Pat. No. 5,925,500 to Yang, et al., herein incorporated by reference, which discloses slip films modified with a UV absorber as the mask layer, thus employing a laser to selectively ablate the modified slip film; and U.S. Pat. Nos. 5,262,275 and 6,238,837 to Fan, the subject matter of each of which is herein incorporated by reference in its entirety.

The photocurable element may further comprise an oxygen barrier layer or other film disposed thereon. While in some embodiments, it is desirable that the oxygen barrier layer be laminated onto the photocurable laminate material after the element has been imagewise exposed to actinic radiation, in other embodiment, the oxygen barrier layer may be laminated onto raw photocurable material (or the cap layer, if used) prior to the imagewise exposure step and thus constitute one of the additional layers described herein.

A wide range of materials can serve as the barrier membrane layer. Three qualities that the inventors have identified in producing effective barrier layers include optical transparency, low thickness and oxygen transport inhibition. Oxygen transport inhibition is measure in terms of a low oxygen diffusion coefficient. As noted, the oxygen diffusion coefficient of the membrane should be less than $6.9 \times 10^{-9}$ $m^2$/sec., preferably less than $6.9 \times 10^{-10}$ $m^2$/sec. and most preferably less than $6.9 \times 10^{-11}$ $m^2$/sec.

Examples of materials which are suitable for use as the barrier membrane layer of the present invention include those materials that are conventionally used as a release layer in flexographic printing elements, such as polyamides, polyvinyl alcohol, hydroxyalkyl cellulose, polyvinyl pyrrolidone, copolymers of ethylene and vinyl acetate, amphoteric interpolymers, cellulose acetate butyrate, alkyl cellulose, butyral, cyclic rubbers, and combinations of one or more of the foregoing. In addition, films such as polypropylene, polyethylene, polyvinyl chloride, polyester and similar clear films can also serve well as barrier films. In one preferred embodiment, the barrier membrane layer comprises a polypropylene film or a polyethylene terephthalate film. One particularly preferred barrier membrane is a Fuji® Final Proof receiver sheet membrane available from Fuji Films.

Finally, in instances where the customer does not desire to immediately subject the photocurable laminate material to other processing steps to prepare the relief image printing element, a strippable or removable coversheet may be laminated or otherwise affixed to the top layer of the photocurable laminated printing blank to protect the photocurable laminate printing blank from damage during storage.

It is also envisioned that the steps described herein can be performed in any order. For example in an embodiment in which the raw photocurable material comprises a first strippable coversheet and a second strippable coversheet, in one embodiment, both the first strippable coversheet and the second strippable coversheet may be removed first so that the raw photocurable plate may be further processed to laminate or otherwise adhere one or more backing layers to a first side of the raw photocurable material and to laminate or otherwise adhere lamination layers to a second side of the raw photocurable material. In another embodiment, the first strippable coversheet is r emoved first and the one or backing layers adhered to the first side of the raw photocurable material and then the second strippable coversheet is removed so that one or more lamination layers can be applied to the second side of the raw photocurable material.

Furthermore, the lamination of the one or more lamination layers may be accomplished in sequence to laminate or otherwise adhere multiple lamination layers to the raw photocurable material, with the each subsequent layer being applied on the previously applied layer. In the alternative, several lamination layers may be laminated together into a composite cover element and the composite cover element laminated or otherwise adhered to the raw photocurable material.

In all of these embodiments, the end result is a laminated photocurable printing blank in which the layer of photocurable layer and the various other layers are firmly adhered to each other to produce a printing blank that it is capable of producing a good quality relief image print element according to the customers' requirements upon further processing.

In one embodiment, in the case of a digital printing element blank, once the laminated photocurable printing blank has been prepared with a mask layer as one of the laminate layers and the mask layer has been processed to produce an in situ negative, such as by laser ablation of the mask layer, ink jet printing, or other similar processes, a barrier layer is disposed on top of the relief image printing plate to cover the in situ mask and any uncovered portions of photocurable layer. In a preferred embodiment, the barrier layer is laminated to the surface of the printing plate using pressure and/or heat in a lamination system, which may be the same lamination system that is used to create the laminated photocurable printing blank. The membrane can most beneficially be applied after laser ablation used to create the in situ mask, but before exposure to actinic radiation.

Once the laminated printing blank has been prepared and then imagewise exposed to actinic radiation, it may be developed to remove non-crosslinked photopolymer and reveal the relief image therein. In addition, if necessary one or more of the at least one lamination layers may also be developed away or otherwise removed. Typical methods of development include washing with various solvents or water, often with a brush. Other possibilities for development include the use of an air knife or heat plus a blotter (thermal development). The resulting surface has a relief pattern that reproduces the image to be printed. The relief pattern typically comprises a plurality of dots, and the shape of the dots and the depth of the relief, among other factors, affect the quality of the printed image.

The printing element may also be subjected to various additional steps as known in the art to produce the desired relief image printing element. For example, many flexographic printing plates are uniformly post-exposed to ensure that the photopolymerization process is complete and that the plate will remain stable during printing and storage. This post-exposure step utilizes the same radiation source as the main exposure. Detackification (which can also be referred to as light finishing) is another optional post-development treatment which can be applied if the surface is still tacky, such tackiness not generally being removed in post-exposure. Tackiness can be eliminated by methods known in the art, such as treatment with bromine or chlorine solutions.

The final result is a customized printing element that has been prepared in accordance with the needs and desires of the customer. In addition, if the customer determines that additional changes to the photocurable printing blank are necessary (or desired), the customer can make such additional changes in a quick and easy manner, without having to re-order a whole new printing element from the manufacturer. After the relief image is developed, the relief image printing element may be mounted on a press and printing commenced.

In another embodiment, and as illustrated in FIG. 1, the present invention relates generally to a lamination system that can be used by the customer to create the custom laminated photocurable printing blank. In one embodiment, the lamination system comprises:

a) a heatable laminating roller 4 and a second roller 6, wherein said heatable laminating roller 4 and said second roller 6 are opposably mounted and form a nip therebetween for receiving a substrate 10 to be laminated, wherein the substrate 10 comprises a strippable cover sheet 12 on a first surface thereof;

b) a first stripping device 14 for stripping the strippable cover sheet 12 from the first surface of the substrate 10, c) a drive mechanism for rotating the heatable laminating roller 4 and second roller 6, wherein the heatable laminating roller 4 is rotated in a first direction and the second roller 6 is rotated in an opposite direction to advance the substrate 10 through the nip formed between the heatable laminating roller 4 and second roller 6;

d) a supplying device for supplying a lamination film 20 into the nip formed between the heatable lamination roller 4 and the second roller 6, wherein the supplying device comprises a second stripping device 24 for stripping a cover sheet 26 from a first surface of the lamination film 20 prior to the lamination film 20 entering the nip, wherein the first surface of the lamination film 20 contacts the first surface of the substrate 10 at a point where the substrate 10 advances through the nip.

The drive mechanism for rotating the heatable laminating roller 4 and the second roller 6 typically comprises a driver which drives a motor to rotate the heatable laminating roller 4 in a first direction and the second roller 6 in a second direction.

The heatable laminating roller 4 typically comprises a heated core that can be controlled to maintain an outer surface of the heatable laminating roller 4 at a desired temperature with an elastic roller disposed around the heated core that may be formed of silicone rubber or another similar elastic material. Suitable control means (not shown) can be used to maintain the heatable laminating roller 4 at the desired temperature for the particular lamination film 20 being used. In addition, if different lamination films 20 are laminated with different temperature needs, the control means can be adjusted to change the temperature of the heatable lamination roller 4. Furthermore, in some situations, the first surface of the substrate 10 or the first surface of the lamination film 20 may be sufficiently sticky or tacky such that an elevated temperature is not required and the laminating roller 4 can be maintained at room temperature such that only pressure is used to laminate the layers together.

The heatable laminating roller 4 is typically maintained at a temperature of between about room temperature and about 300° F. In some embodiments, it is desirable that the heatable laminating roller 4 be maintained at a temperature of at least about 150° F., more preferably at a temperature of at least about 200° F. However, one skilled in the art would recognize that the temperature of the heatable laminating roller 4 would depend at least in part on the melting point of the particular lamination layer 20 selected and would choose a suitable temperature of the heatable laminating roller 4 accordingly. In addition, the temperature of the heatable lamination roller 4 is adjustable based on the particular layer being laminated to the raw photocurable material. That is, certain materials may require a higher (or a lower) temperature to firmly adhere the layers together.

The lamination speed of the various materials through the nip between the laminating roller and the second roller may be adjusted based in part on the materials being laminated. Thus, a faster or slower lamination speed may be chosen depending on the materials being laminated.

The first strippable device 14 and the second strippable device 24 generally comprise a device that is capable of removing a strippable cover sheet 12 or cover layer 26 from a surface. Thus, the first strippable device 14 and/or the second strippable device 24 may each comprise a plow, such as described in U.S. Pat. No. 7,802,598 to Zwadlo, the subject matter of which is herein incorporated by reference in its entirety. In the alternative, the first strippable device 14 and/or the second strippable device 24 may comprise a blade or other similar device that is capable of cleanly removing a strippable coversheet 12 or covers layer 26 without damage to the underlying layer.

The supplying device for supplying a lamination layer 20 into the nip formed between the heatable lamination roller 4 and the second roller 6 may comprise a lamination layer supply roller adapted to support a roll of lamination layer 20 and supply the lamination layer 20 over an outer surface of the heatable laminating roller 4 and into the nip formed between the heatable laminating roller 4 and the second roller 6. In this instance, the second stripping device 24 can be positioned adjacent to the lamination layer supply roller to remove the coversheet 26 as the lamination layer 20 exits the supply roller. In the alternative, the supplying device may comprise a planar support that transports the lamination layer 20 to the nip formed between the heatable laminating roller 4 and the second roller 6 and the second stripping device 24 is positioned at a point prior to a point where the substrate 10 advances through the nip. Finally, in some embodiments, it may be desirable to provide a guide roller 30 opposite the heatable laminating roller 4 and forming a secondary nip through which the lamination layer 20 can be guided into the nip between the heatable laminating roller 4 and the second roller 6 to properly position the lamination layer 20 on the substrate 10.

The lamination system may further comprise means for trimming the laminated substrate as is generally well known in the art. In one embodiment, the means for trimming the laminated substrate is a rotating cutter. Other suitable cutting and trimming means would also be usable in the practice of the invention.

In addition, the substrate, including, for example a raw photocurable material may also be sufficiently thin and flexible such that it may be supplied to the nip from a supply roller of the raw photocurable material. Thus, in some embodiments, the raw photocurable material comprises a roll of material and in other embodiments, the raw photocurable material is in pre-cut sheet form.

As is readily seen, the apparatus described herein can be used to laminate raw photocurable materials and lamination layers in sheet form, in which the raw photocurable materials and selected lamination layers have been pre-cut to the desired size of the laminated printing plate structure. In the alternative, the various raw photocurable materials and the lamination layers may be disposed on a roller and the lamination step performs the additional step of cutting the laminated layers to the desired size. Thus, it is possible for the customer to produce a custom laminated printing plate element that is customized to the desired size.

The present invention also relates generally to a method of doing business in which a customer obtains the desired layers of material to produce a custom photocurable printing blank.

Thus, in another embodiment, the present invention also relates generally to a menu system for order various individual components of a photocurable printing blank to create a custom laminated printing blank comprising the various individual components, the menu system comprising:

a) a first menu comprising a listing of one or more raw photocurable materials;

b) a second menu comprising a listing of one or more lamination layers, wherein the one or more lamination layers are capable of being laminated to the one or more raw photocurable materials to create the laminated photocurable printing blank; and wherein a customer selects one or more raw photocurable materials form the first menu and one or more lamination layers from the second menu and then laminates or otherwise adheres the one more photocurable materials and one or more lamination layers together to form a custom laminated printing blank.

As described herein, the customer can order one or more raw photocurable materials and one or more lamination layers from the manufacturer and then laminate or otherwise adhere the various layers together to create the custom laminated printing blank.

The menu system is used to allow the customer to select the various materials. A customer would first choose a raw photocurable material based on various factors, including, for example, digital or analog, particular inks used for printing, development with particular solvents or thermal development, for printing on particular substrates, among others. In addition, a dialog box can also be used to assist a customer in this manner. For example, a dialog box can be used to query whether the platemaking process is digital or analog, the type of substrate to be printed or the particular development method and suggest suitable raw photocurable materials based on the inputted information.

In addition, once the customer has chosen the raw photocurable material, the customer can then also choose from one or more plate gauges to produce a printing element of a desired thickness. The customer can also choose whether they would like multiple layers of the same raw photocurable material or layers of different raw photocurable materials. The customer can also choose the form of the raw photocurable material and lamination layers which may be either in sheet form or as a roll of material that would allow the customer to create printing blanks of various sizes and shapes from the same material.

Thereafter, based on the particular raw photocurable materials chosen, the customer can select various lamination layers that would be compatible with the particular raw photocurable materials. Thus, in a preferred embodiment, the menu of lamination layers is tailored to the particular raw photocurable material(s) chosen and further may be tailored to the different lamination layers so that a customer would be unable or at least dissuaded from selecting combinations of raw photocurable materials and lamination layers that would not produce a good result. The menu system may also set up so that the customer can input various parameters and the menu system presents suitable combinations. If desired, the system can also save information related to a particular customer so as to streamline the ordering process.

As with the raw photocurable material, the customer may also be able to choose various gauges of certain lamination layers and the form of the lamination layers.

Upon receipt of the selected raw photocurable materials and the lamination layers, the customer uses the laminating system described herein to remove a strippable coversheet from at least one of a first or second side of the raw photocurable material and the from a side of the additional layer of material and laminate or otherwise adhere the layers together to form a laminated material having a layer of photocurable material and the additional layer(s) adhered thereon. This process can be repeated to laminate or otherwise adhere additional layers and create the unique laminated photocurable element having the desired properties.

Finally, while the present invention is described in terms of flexographic relief image printing elements, it is also contemplated that the processes and system described herein would be applicable to the production of other types of multilayered printing blanks and other multilayered products where customization is desirable, such as printed circuit board precursors, in which a raw substrate layer and one or more lamination layers may be joined together to form a custom laminated product.

What is claimed is:

1. A method of creating a custom relief image printing element from at least one raw photocurable material and at least one lamination layer supplied by a manufacturer, wherein the manufacturer provides a menu of raw photocurable materials and a menu of lamination layers, and wherein a customer selects at least one raw photocurable material from the menu of raw photocurable materials and selects at least one lamination layer from the menu of lamination layers; the method comprising the steps of:
   a) providing the selected at least one raw photocurable material and the selected at least one lamination layer to the customer, wherein the at least one raw photocurable material provided to the customer comprises a first strippable coversheet attached to a first side of the at least one raw photocurable material and a second strippable coversheet attached to a second side of the at least one raw photocurable material;
   b) removing the first strippable coversheet from the first side of the at least one raw photocurable material and laminating at least one lamination layer to the first side of the at least one raw photocurable material and removing the second strippable coversheet from the second side of the at least one raw photocurable material and laminating at least one lamination layer to the second side of the at least one raw photocurable material at the customer's location; and thereafter
   c) imagewise exposing the photocurable material to actinic radiation at the customer's location to crosslink and cure portions of the at least one raw photocurable material and create a relief image therein;
      wherein the at least one lamination layer laminated to the first side of the at least one raw photocurable material upon removal of the first strippable coversheet comprises one or more backing layers.

2. The method according to claim 1, wherein the menu of raw photocurable materials comprises photocurable materials having different formulations and different gauges.

3. The method according to claim 1, wherein the menu of lamination layers comprises lamination layers selected form the group consisting of backing layers, coversheets, cover films, adhesive layers, additional raw photocurable layers, cap layers, compressible layers, slip films, release layers, matte layers, laser ablatable layers, masking layers, oxygen barrier layers, other intermediate layers and combinations of the foregoing.

4. The method according to claim 1, where step b) is repeated multiple times, wherein additional lamination layers are laminated to a top of a preceding lamination layer to create a photocurable printing blank.

5. The method according to claim 1, wherein the lamination step comprises introducing the at least one raw photocurable material and the at least one lamination layer into a nip formed between a heatable laminating roller and a backing roller.

6. The method according to claim 5, wherein the lamination step is conducted under process conditions that do not cause premature photocuring of the at least one raw photocurable material or damage to the at least one lamination layer.

7. The method according to claim 1, further comprising the step of developing the laminated printing blank to remove non-crosslinked photopolymer and reveal the relief image therein.

8. A method of creating a custom relief image printing element from at least one raw photocurable material and at least one lamination layer supplied by a manufacturer, wherein the manufacturer provides a menu of raw photocurable materials and a menu of lamination layers, and wherein a customer selects at least one raw photocurable material from the menu of raw photocurable materials and selects at least one lamination layer from the menu of lamination layers; the method comprising the steps of:
   a) providing the selected at least one raw photocurable material and the selected at least one lamination layer to the customer, wherein the at least one raw photocurable material provided to the customer comprises a first strippable coversheet attached to a first side of the at least one raw photocurable material and a second strippable coversheet attached to a second side of the at least one raw photocurable material;
   b) removing the first strippable coversheet from the first side of the at least one raw photocurable material and laminating at least one lamination layer to the first side of the at least one raw photocurable material and removing the second strippable coversheet from the second side of the at least one raw photocurable material and laminating at least one lamination layer to the second side of the at least one raw photocurable material at the customer's location; and thereafter c) imagewise exposing the photocurable material to actinic radiation at the customer's location to crosslink and cure portions of the at least one raw photocurable material and create a relief image therein;

wherein the at least one lamination layer laminated to the second side of the at least one raw photocurable material upon removal of the second strippable coversheet comprises one or more additional raw photocurable materials or a cap layer, wherein the one or more additional raw photocurable materials or the cap layer may be of the same composition as the at least one raw photocurable material or a different composition.

\* \* \* \* \*